(12) United States Patent
Beaman et al.

(10) Patent No.: US 7,135,877 B2
(45) Date of Patent: Nov. 14, 2006

(54) TEMPERATURE AND CONDENSATION CONTROL SYSTEM FOR FUNCTIONAL TESTER

(75) Inventors: Daniel Paul Beaman, Cedar Park, TX (US); John Saunders Corbin, Jr., Austin, TX (US); Dales Morrison Kent, Round Rock, TX (US); Howard Victor Mahaney, Jr., Cedar Park, TX (US); Hoa Thanh Phan, Austin, TX (US); Frederic William Wright, IV, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/923,296

(22) Filed: Aug. 20, 2004

(65) Prior Publication Data
US 2005/0030053 A1 Feb. 10, 2005

Related U.S. Application Data

(62) Division of application No. 10/635,077, filed on Aug. 6, 2003, now abandoned.

(51) Int. Cl.
*G01R 31/02* (2006.01)
*H05K 7/20* (2006.01)

(52) U.S. Cl. ............... 324/760; 165/80.3; 165/80.4; 324/158.1; 361/696

(58) Field of Classification Search .......... 324/760; 165/80.1–80.4
See application file for complete search history.

(56) References Cited

U.S. PATENT DOCUMENTS

| | | | |
|---|---|---|---|
| 5,692,556 A | 12/1997 | Hafner | 165/30 |
| 5,778,968 A * | 7/1998 | Hendrickson et al. | 165/80.1 |
| 5,977,785 A | 11/1999 | Burward-Hoy | 324/760 |
| 6,191,599 B1 * | 2/2001 | Stevens | 324/760 |
| 6,257,319 B1 | 7/2001 | Kainuma et al. | 165/11.1 |
| 6,617,868 B1 | 9/2003 | Needham | 324/760 |
| 6,711,961 B1 * | 3/2004 | Theriault et al. | 73/865.6 |
| 6,750,646 B1 * | 6/2004 | Voss et al. | 324/158.1 |
| 6,762,616 B1 | 7/2004 | Kawaguchi et al. | 324/765 |
| 6,771,086 B1 * | 8/2004 | Lutz et al. | 324/760 |
| 6,863,123 B1 * | 3/2005 | Wang et al. | 165/263 |
| 2002/0014894 A1 | 2/2002 | Yonezawa et al. | 324/760 |
| 2002/0145439 A1 * | 10/2002 | Gaasch et al. | 324/760 |
| 2004/0027147 A1 * | 2/2004 | Yamashita | 324/755 |
| 2004/0178808 A1 * | 9/2004 | Walter | 324/703 |
| 2005/0040838 A1 * | 2/2005 | Cannon et al. | 324/765 |

* cited by examiner

*Primary Examiner*—Vinh Nguyen
*Assistant Examiner*—Emily Y Chan
(74) *Attorney, Agent, or Firm*—Duke W. Yee; Thomas E. Tyson; Peter B. Manzo (57) ABSTRACT

An innovative chip testing system and method includes controlling temperature and condensation during testing. Coarse temperature is controlled by providing a desired fluid flow rate and fluid temperature to a cold plate. Fine temperature control is provided by a feedback loop which controls the power dissipation of cartridge heaters installed within the cold plate. Condensation control is provided by insulating various components of the system, manipulation of dry compressed air in enclosures to reduce surface dew point temperatures, usage of cartridge heaters in a card backside stiffener plate, and by providing a heatsink assembly which prevents condensation on the insulation.

12 Claims, 5 Drawing Sheets

TEMPERATURE AND CONDENSATION CONTROL SYSTEM FOR FUNCTIONAL TESTER

This application is a divisional of application Ser. No. 10/635,077, filed Aug. 6, 2003 ABN, status pending, which is herein incorporated by reference.

BACKGROUND OF THE INVENTION

1. Technical Field

The present invention relates generally to integrated circuit (IC) processing and testing, and particularly to temperature and condensation control in a chip tester.

2. Description of Related Art

High performance processor chips or integrated circuits (ICs) often must be tested and subsequently sorted based on their performance and matched to a given class of machine. Individual chips are tested prior to installation on modules in machines in order to identify chip failures, allowing higher machine manufacturing productivity and improving product quality. Test equipment developed to support performance, productivity and quality is usually required to meet functional test limits defined by several boundary variables such as chip/module voltage, clock speed, power dissipation, and temperature.

Chip testing often requires the chips to be cooled to low temperatures. For example, some processor chip test requirements establish a need for cooling devices to temperatures as low as −20 C. Accurate temperature control over a wide range of temperatures during chip testing processes allows verification of whether a processor functions, and more specifically how many of its processor cores function. It also detects more of the faulty chips early in the manufacturing process. For example, two conductors can be touching each other with sufficient force that an electrical connection is made, even though the parts are not mechanically interconnected. Such a part may pass tests and reach a customer, but will fail at a higher frequency rate than is acceptable. If a chip is tested at low temperatures, this marginal interconnection may separate, and thereby identify the faulty part.

Similarly, some chip failure modes are found only at elevated temperatures, while other early use failures which might not have occurred until after reaching a customer may be found during testing at elevated temperatures. Varying temperature testing also allows more precise determination of chip speed, helping to minimize the guardband (i.e., extra margin) that is put into the acceptance criteria for a good chip, allowing an increase in the manufacturing yield.

Alternatives to a precisely controlled thermal system result in less thermal control and hence fewer faults are found, and more guardband must be allowed to ensure the chip will function in the customer environment.

However, testing at varying temperature also raises certain problems. For instance, the manufacturing environment in which some chip testers operate contain atmospheric conditions with a dew point of 17 C, for example. Clearly, any tester surfaces exposed to this environment and operating at −20 C contains mechanical components with surface temperatures that are well below the dew point and will cause condensation of the water vapor in the air on those surfaces. Condensed water within the machine could cause electrical shorts, destroying the tester and/or the tested chip or module. In addition, condensed water escaping from the tester would disrupt manufacturing operations due to safety and related issues.

SUMMARY OF THE INVENTION

The present invention is directed to a temperature and condensation control system for chip testing environments. In a brief summary of a preferred embodiment, multiple features are implemented to incorporate a highly selectable temperature control system while reducing exposure of test equipment and chips to condensation from the environment, particularly at low test temperatures. These features preferably include passing a refrigerated liquid (e.g., 0 C to −20 C) at a predetermined flow rate through a cold plate which is spring loaded against the chip to be tested. The temperature of the chip is measured by OCTS (On Chip Temperature Sensors) and is controlled via a feedback loop which responds by modulating the power applied to cartridge heaters embedded in the cold plate other features of the temperature control aspect of the innovative testing system are described further below.

In order to reduce problems caused by condensation in the innovative testing system, water vapor in the ambient air is prevented from condensing on tester mechanical components. The chilled fluid passed through the cold plate causes a decrease in temperature of hoses, fittings, manifolds, the cold plate itself, and related mechanical parts so that frost formation or liquid water condensation occurs unless measures are taken. An enclosure is used around the test equipment and certain subparts thereof (e.g., the nest) such that dry compressed air may be injected into the enclosure to maintain atmospheric relative humidity within the enclosure at levels preventing condensation on surfaces. Compressed air inlets are positioned so that a rotational air flow pattern is preferably established, covering the entire test surface more efficiently and allowing prevention of condensation with less dry air. Such air flow is also preferably limited to the times when chips are actually in test mode. Other features of the condensation control aspect of the present innovative testing system include limiting air flow to enclosures containing low temperature components, closed cell foam pipe insulation to control condensation and frost formation on coolant hoses and fittings, and polymer coolant hose clamps to provide thermal properties preventing condensation. Additionally, one or more cartridge heaters are preferably inserted in the card backside socket retention stiffener plate to control condensation on the bottom of the card, and a metal heat sink with hose insulation retention devices control condensation at locations where insulated hoses touch fitting junctures. Further features and details are described below.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figures 1, 6:
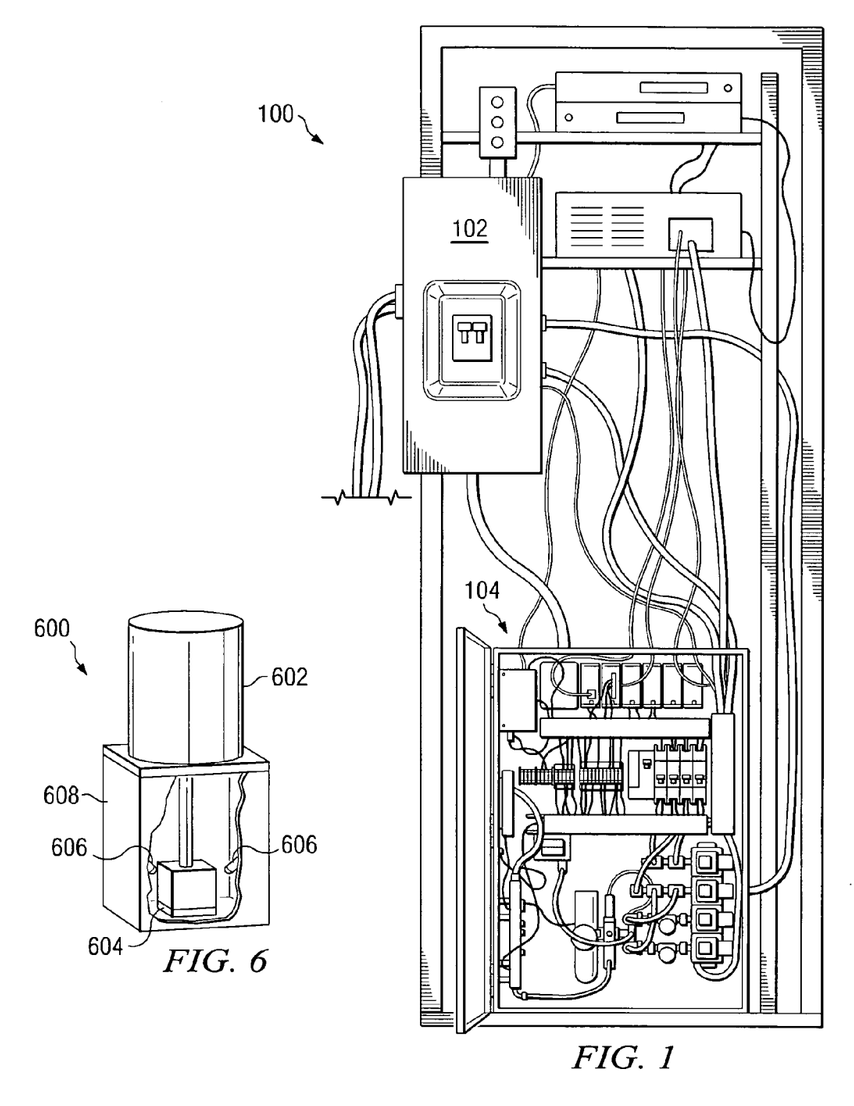
FIG. 1 shows an innovative testing unit consistent with implementing a preferred embodiment.
FIG. 6 shows part of the nest assembly according to a preferred embodiment.

The present invention is described with reference to the several figures. FIG. 1 shows a rear view of a testing unit consistent with a preferred embodiment. Unit 100 includes equipment necessary for performing testing of chips, such as a nest (not shown, see FIG. 3), thermal control box 104, and power box 102. In addition, innovative testing unit 100 includes a chiller for supplying cooled fluid, and card for receiving the chip to be tested. In a preferred embodiment, the nest centers on the location where the tested chip sockets to the card.

Figure 2:
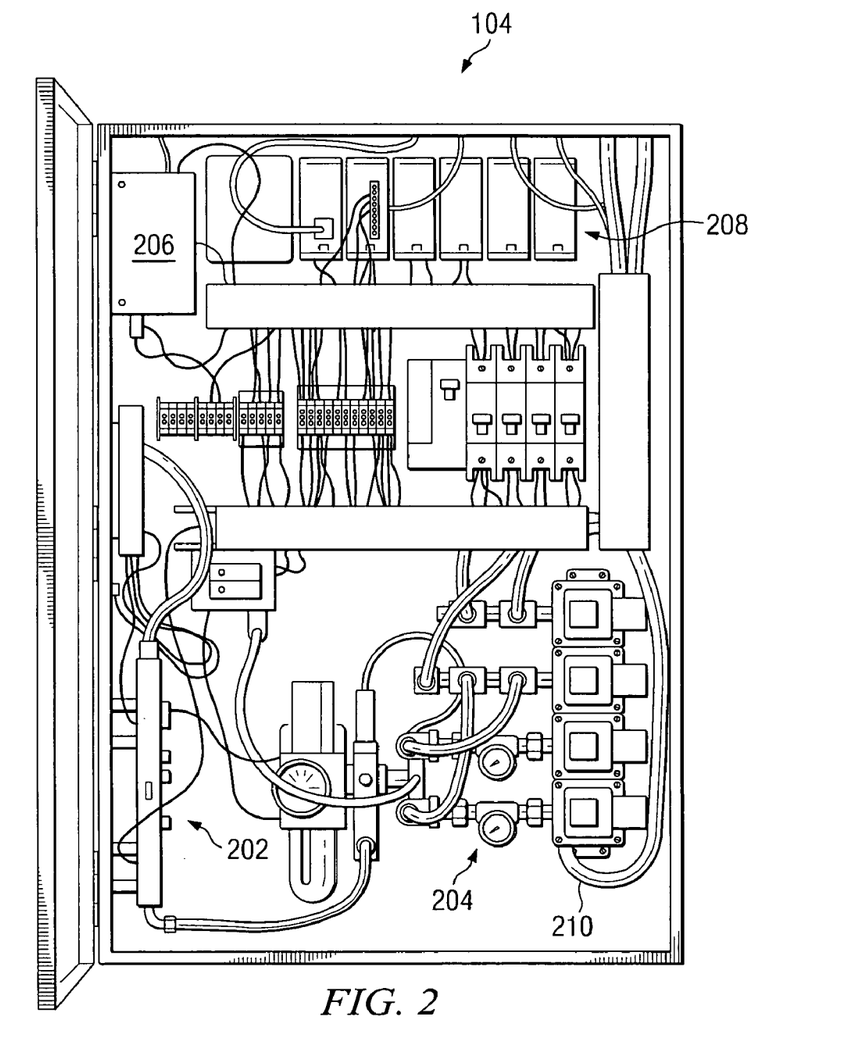
FIG. 2 shows the thermal control box for the innovative testing unit consistent with a preferred embodiment.

FIG. 2 shows a detail of the thermal control box. The box 104 is preferably filled with dry air to reduce condensation, as described below. In a preferred embodiment, it includes air/helium controls 202 which provide control for injection of dry air where condensation control is required. Compressed air is also used to drive the cold plate up and down, while helium is preferably used to improve the thermal interface between the chip and cold plate. Chilled fluid passes through hoses 210 through fluid manifold/needle valves 204 having at least one input and several output ports, and a throttle for controlling the rate of chilled fluid transfer through the cold plate (not shown). Heater power supply 206 offers power to cartridge heaters of the cold plate itself and of the card backside. Programmable logic controller (PLC) 208 controls most functions of the box 104, such as controlling fluid flow, and managing a feedback loop which allows temperature to be maintained at a desired setpoint during testing of a chip. The function of these components will be more fully described below.

Figure 3:
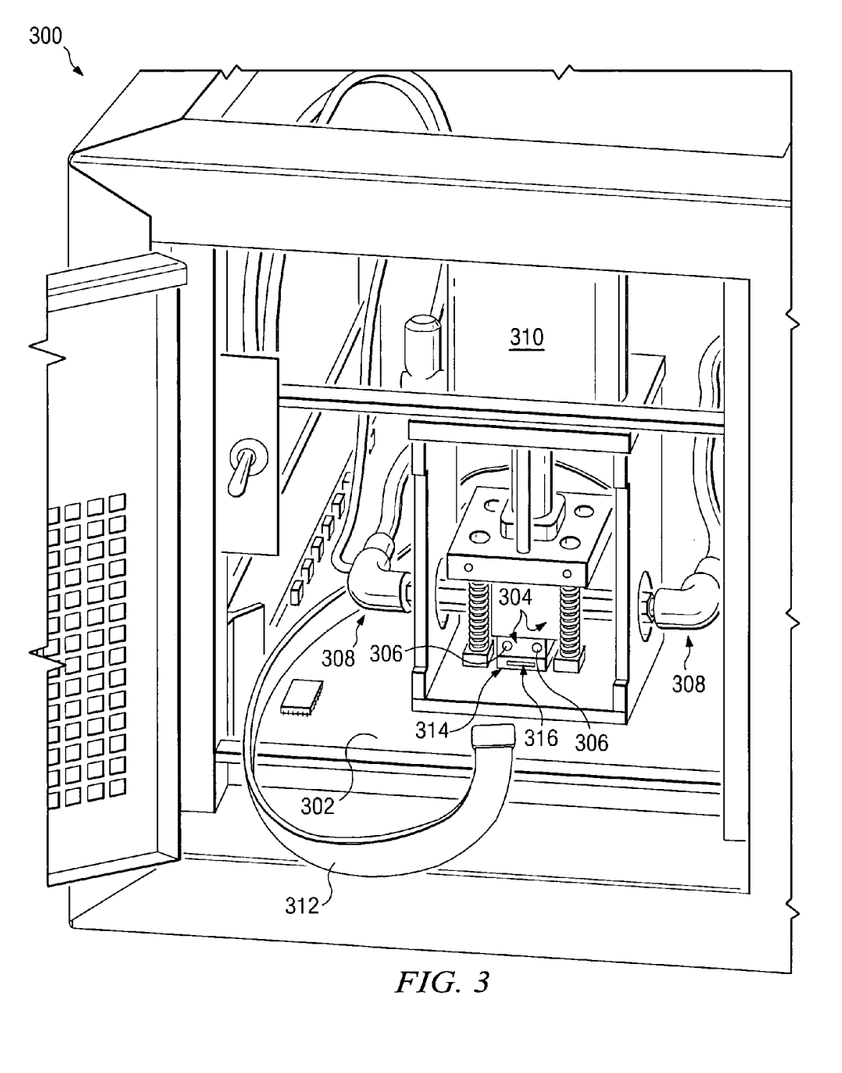
FIG. 3 shows the nest of the innovative testing unit consistent with a preferred embodiment.

FIG. 3 shows a view of nest unit 300. Nest unit 300 includes card 302 that includes a socket for chip 314 to be tested. Card 302 is preferably equipped with cartridge heaters (not shown) on its backside, which is preferably used to control the temperature of the backside so as to reduce condensation formation while cold plate 304 is chilled by fluid. Cartridge heaters are preferably implemented as small diameter cylinders, for example, that are essentially resistors that dissipate heat.

Cold plate 304 also includes cartridge heaters 306, which are preferably embedded, to increase the temperature of cold plate 304 in response to a feedback loop. The feedback loop is intended to detect the temperature of chip 314 at various locations by use of on chip temperature sensor 316, which is embedded in chip 314. This temperature information, which is based on the output of on chip temperature sensor 316, is used to maintain a constant or desired temperature of chip 314 by varying the power supplied to embedded cartridge heaters 306. Broadly speaking, for a given test condition chilled fluid is flowed through cold plate 304 at a constant flow rate and temperature to provide gross temperature control, while embedded cartridge heaters 306 respond to on chip temperature sensor 316, which is connected to a programmable logic controller, such as programmable logic controller 208 in FIG. 2, via on chip temperature sensor cables 312 to form the feedback loop that provides automatic fine sense temperature control of chip 314. For the next test condition, the fluid temperature and/or flow rate can be adjusted, and the feedback control continues. Cold plate 304 is preferably pressed against chip 314, its surface flattened to provide good contact between cold plate 304 and chip 314's surface. Other specific features of cold plate 304 are further described below.

Fluid lines 308 supply chilled fluid to cold plate 304 while air cylinder 310 provides pneumatic pressure driving cold plate 304 against chip 314, electrically engaging chip 314 under test to the pogo-pin socket and ultimately to card 302.

Figure 4A:
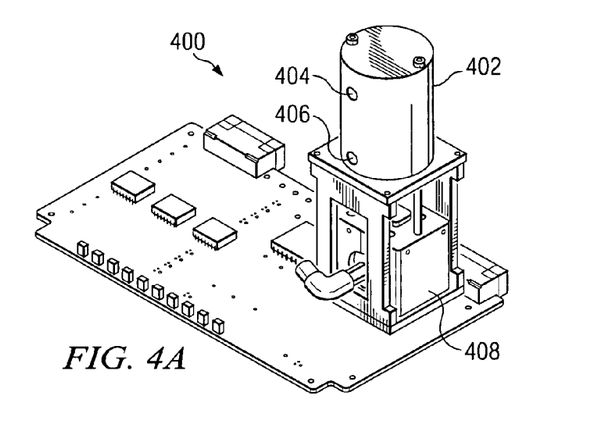
FIGS. 4A–4C show detail views of the nest of the innovative testing unit consistent with a preferred embodiment.
Figure 4B:
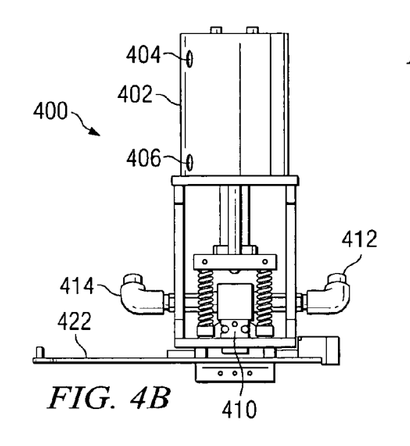
Figure 4C:
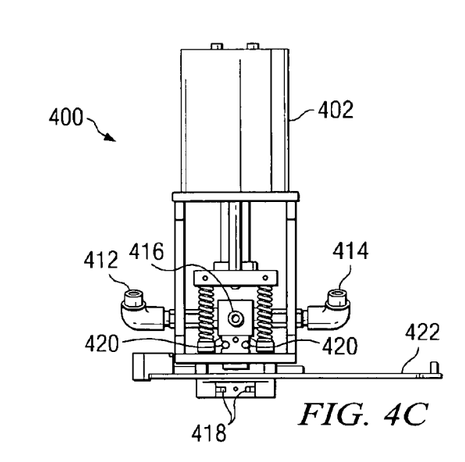

Nest unit 300 preferably includes an enclosure surrounding the socket for the chip and cold plate 304. FIGS. 4A–C show various views of the nest and card. FIG. 4A shows nest 400 with air cylinder 402 having inlets 404, 406 that pneumatically control the pressure of the test module against the socket. Housing 408 forms an enclosure around the chip area and cold plate so that dry compressed air can be pumped in, eliminating condensation of liquids on components. Housing 408 is preferably transparent, though any method of restricting air flow is within the contemplation of the present invention. Mounted to the housing are air nozzles (not shown) that provide dry air to enclosure. In a preferred embodiment, nozzles are positioned to direct air in a circular pattern within enclosure, so that complete coverage of components is obtained with as few nozzles as possible. FIG. 4B shows a front view of the nest assembly 400. Cold plate thermocouple 410 is depicted which measures the temperature of the cold plate.

FIG. 4C shows a rear view of nest assembly 400. Coolant outlet 412 and inlet 414 provide passage of chilled fluid to and from the cold plate, preferably maintaining the flow rate according to the particular test phase requirements. Valves in the temperature control box preferably control the fluid flow. Helium purge 416 delivers helium to the cold plate/chip interface, which replaces the air that would normally be there, and improves heat transfer between the chip and cold plate.

Backside heaters 418 are preferably positioned on the backside of the card 422 to prevent temperature there from becoming low enough that frost or condensation forms. This is discussed further below. Cold plate heaters 420 of the cold plate are also shown. These respond to the feedback loop using information from the OCTS, and provide temperature control to the chip.

The functions of the temperature control system of the innovative testing unit include several features. A functional tester, referred to as ERIF (Early Run-in Functional), is employed in manufacturing to ensure the quality and robustness of processors before they are placed in a server and shipped to customers. Many processors have multiple processor cores on a single silicon chip. The goals of such testing includes verifying how many of the processor cores are good, sorting the processors into different buckets so they can be used in the corresponding speed rated product, and providing some burn-in of the chips to find early faults.

The innovative testing equipment can perform such tests in 1–4 hours for each chip. During this time, differing software applications are run on the chip. Each of the applications results in differing power dissipation within the chip. It has been found that different modes of chip failure are evidenced more easily at differing temperatures. Additionally, the speed sorting of the chips must be done at the temperature they will run at in the actual product. Hence, the innovative ERIF testing unit must be able to control the chip under test to a wide range of pre-specified temperatures at differing parts of the test.

To achieve these requirements, the innovative thermal control system comprises a low temperature chiller, a nest assembly, and a thermal control system. The chiller provides a low temperature source of liquid. For instance, flow rates up to 1.6 gallons/minute of a 50/50 mixture of ethylene glycol and water at a temperature of −20 C can be provided. The cold liquid flows from the chiller through insulated lines to the thermal control box (see FIG. 2) where the flow rate is controlled by a manifold and series of valves. The thermal control box provides the desired amount of flow rate to the nest.

The chilled fluid flows through the cold plate, which in a preferred embodiment is made of copper for its heat conducting properties. The air-actuated cylinder drives the copper cold plate to the down position, electrically engaging the processor under test to the socket of the processor card. This completes the thermal path from the chip to the cold plate to the cold fluid within the cold plate.

A thermal feedback loop, with input from the OCTS, maintains the required temperature setpoints by varying the power dissipated at the cartridge heaters which are mounted into the cold plate. In a preferred embodiment, there are two such cartridge heaters positioned to provide even heat distribution to the cold plate and ultimately the chip. The interface resistance between the cold plate and chip is minimized by a gimbaled cold plate, high pressure spring load, and controlled flatness of the cold plate. Additionally, as previously described, helium is injected at the cold plate/chip interface to replace the air that would normally occupy small spaces between the two surfaces, improving the interface thermal resistance. The cold plate pedestal must be smaller than the surface of the chip to mitigate cracking of the chip when pressure is applied. However, in preferred embodiments, the cold plate is as large as possible to minimize temperature gradients. Temperature gradients are also minimized by the preferred choice of copper for the cold plate material, which has a high thermal conductivity.

Testing of the chip is preferably performed at multiple different temperature setpoints. These temperatures are measured preferably using the OCTS of the chip itself. A predetermined fluid flow rate is chosen for each setpoint and provided by the chiller, manifold, and series of valves with associated interconnections. The setpoint temperature is preferably maintained by a temperature feedback loop which controls how much power is dissipated by the cartridge heaters in the cold plate. Hence, the chilled fluid flow provides large scale or gross temperature control during testing, while the cartridge heaters controlled by the feedback loop provide small scale or fine temperature control. Temperature control of the cartridges is preferably based on a proportional, integral, derivative (PID) loop.

When a given phase of the testing is completed, the flow rate and/or temperature of the chilled liquid is changed for the next phase to adjust the OCTS temperature to within range of the next desired setpoint. This next phase is typically associated with a different software application, chip voltage, and/or chip frequency, which all contribute to a different chip power dissipation level. The new desired temperature setpoint is maintained via the temperature feedback loop previously described.

Figure 5:
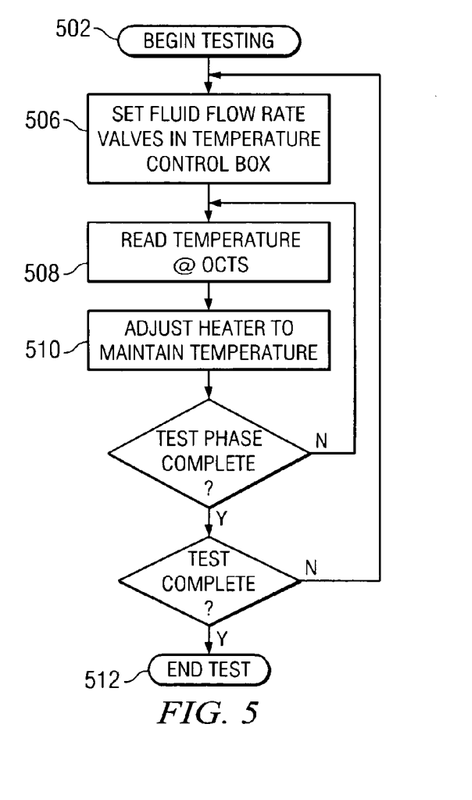
FIG. 5 shows a flow chart for a process consistent with a preferred embodiment of the present invention.

This process is simply described in the flow chart of FIG. 5. The process begins with testing (step 502). Based on the expected power dissipation and required temperature setpoint for that test phase, the fluid flow rate is set using valves in the temperature control box (step 506). The temperature throughout the test phase is read from the OCTS of the test chip (step 508) and when necessary, adjusted by use of cartridge heaters in the cold plate (step 510). When the test phase ends, the process begins again at the next test phase, where the next fluid flow rate is set based on the expected power dissipation and the required temperature setpoint.

Having both gross and fine control of the temperature is valuable because large power swings or spikes occur during a give part of the test, while even larger swings occur between different phases of a test. Hence, the innovative testing apparatus provides temperature control when power dissipation varies dramatically, e.g., 20 W up to 225 W. Note that other testing procedures, such as a typical burn-in, employ significantly different temperature control schemes because the power and temperature setpoints remain largely constant.

The innovative testing system also preferably includes measures for controlling and reducing condensation on the various surfaces and equipment. The condensation control apparatus prevents water vapor in the ambient air surrounding the unit from condensing on tester mechanical components. The liquid chiller reduces the temperature of the heat transfer fluid significantly below dew point. In turn, the chilled fluid lowers the temperature of hoses, fittings, manifolds, the cold plate and related mechanical parts so that frost formation or liquid water condensation occurs on the surfaces unless prevented. In a preferred embodiment, heat transfer and thermodynamic properties of insulation, compressed air, structural polymers, and metal are used to prevent frost or liquid condensation from forming on tester components.

In preferred embodiments of the innovative testing system, some or all of the following features or groups of features are implemented.

Dry compressed air is injected into the enclosures to maintain the atmospheric relative humidity within the enclosure at levels preventing condensation on metal and polymer surfaces. Compressed air inlet nozzles are positioned so as to establish a rotational air flow pattern within a cold plate housing ensuring dry air contacts all sides of the low temperature cold plate. The air flow of the system is also controlled by an air flow control system that limits the duration of compressed air flow to time periods when chips are actually in test.

In addition to the compressed air features, the room ambient air flow paths into enclosures containing low temperature components are minimized, reducing the necessary dry compressed air flow rates. Closed cell foam pipe insulation is used to control condensation and frost formation on coolant hoses and fittings, while a polymer coolant hose clamp preferably provides thermal properties preventing condensation.

Additionally in preferred embodiments, cartridge heaters are placed in the card backside socket retention stiffener plate, to control condensation on the bottom of the card (see FIGS. 4B and 4C). Cold plate/chip thermal interface performance is also improved by balancing forces acting on the cold plate due to coolant line insulation. Finally, a metal heat sink is preferably used to control hose condensation and operates as a hose insulation retention device. This controls condensation at locations where insulated hoses would otherwise touch, and it non-adhesively retains the hose insulation thereby blocking humid air access to hose and fitting junctures that may be below dew point. These features are discussed further with reference to the figures.

As described previously, the primary elements of the cooling system used to control the temperature of the chip under test are the liquid coolant chiller, the thermal control box, the nest assembly, and hoses that transport coolant from the chiller to the TCB, from the TCB to the nest, and from the nest back to the chiller. The chiller cools a heat transfer liquid to, e.g., −20 C for the specific processor test application, and an internal pump provides pressure to move the chilled fluid through components in the fluid loop and returning it to the chiller for reuse. The devices in the chilled fluid loop require mechanisms to prevent frost or condensation formation. In a preferred embodiment, from the chiller the coolant moves through ethylene propylene diene/rubber (EPDM) hoses to the TCB. The TCB preferably controls coolant flow throughout the cooling fluid loop, compressed air flow to the nest air cylinder, cold plate to chip interface gas flow, cartridge heater function, and temperature control functions. From the TCB, chilled fluid passes through EPDM hose to the nest. The nest contains the metal cold plate which absorbs heat from the chip in test and transfers it to the chilled fluid via a set of internal channels. The cold plate position is controlled by an air cylinder which linearly moves the cold plate from an open position which provides an open space through which the module with the chip is manually installed, to a closed position in which heat is transferred from the chip to the cold plate. After the heat transfers from the tested chip to the cold plate and then to the coolant fluid, the fluid is transported by the insulated hose to the TCB and finally back to the chiller where it is again cooled for reuse.

FIG. 6 shows a diagram of some components of the nest assembly 600. Air cylinder 602 and cold plate 604 are depicted with housing 608. Within housing 608 are nozzles 606 designed to provide dry compressed air to prevent condensation on cold tester components. Housing 608 is preferably clear Lexan (TM) and surrounds the exposed periphery of cold plate 604 allowing dry compressed air to be injected through nozzles 606, which helps reduce condensation by lowering the dew point and keeping it below the temperature of equipment chilled by the cooling apparatus. In a preferred embodiment, nozzles 606 feed air into the housing and are quick connect devices facilitating rapid assembly with polymer compressed air lines. The nozzles are preferably positioned to establish circular air flow in the housing, and can be positioned closest to surfaces most likely to have condensation form thereon. For example, placing the nozzles near the bottom of the housing provides more thorough dry air coverage of the cold plate, which is likely to experience condensation. Note that not all components of nest 600 are shown in FIG. 6.

Humid air access paths from the tester room ambient through the Lexan (TM) housing to the dry air space near the cold plate is limited. EPDM hose and its insulation passes through holes on each side of the housing, as shown in FIG. 4A. The holes in the housing 408 are sized slightly smaller than the outside diameter of the insulation to prevent humid ambient air from entering the housing.

When the cold plate is lowered by the air cylinder into its operational position on the chip, the cold plate suspension assembly moves with respect to the Lexan (TM) housing to its final position. After all components in the assembly have reached final position, each hole in the Lexan (TM) housing is concentrically aligned with each fitting that channels coolant through the cold plate and with the fitting insulation. This concentricity provides two advantages: first, it maintains the slight compression of the insulation by the housing hole at the entire perimeter interface of Lexan (TM) and insulation which effectively blocks ambient air access; second, concentric alignment of holes and insulation balances the external forces acting on the cold plate, which improves cold plate/chip thermal interface.

In a preferred embodiment the clamp is counter-bored to provide a tight interface to the hose insulation and to block humid air access to below dew point hose and clamp components, thereby preventing condensation. Preferred embodiments fix the location of the coolant hoses with a hose clamp attached to a bulkhead within the tester. The preferred material for such a clamp is a structural polymer with a low thermal conductivity to mitigate condensation.

Figure 7:
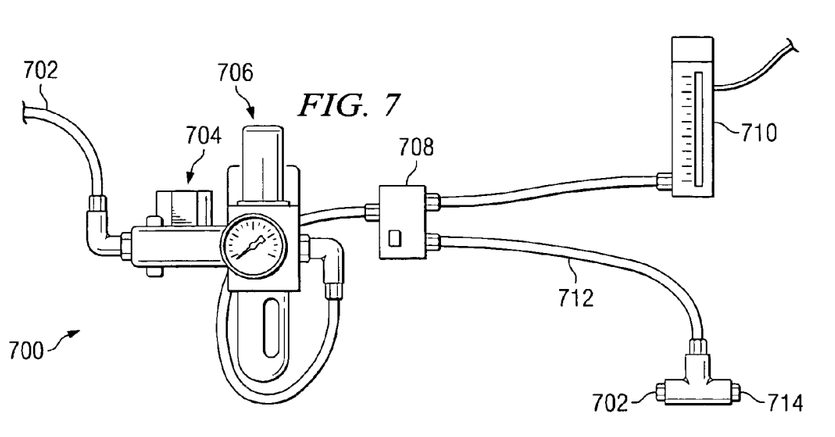
FIG. 7 shows a compressed air control assembly, consistent with a preferred embodiment of the present invention.

Providing dry compressed air to the housing inlet nozzles requires a control function to maintain a given air flow rate of dry air only during the time period when the air cylinder has lowered the cold plate to the chip for test. A control algorithm and the TCB modify coolant flow and activate cartridge heaters in the cold plate and backside card stiffeners to elevate nest component temperatures above the dew point before the cold plate is raised to the open position by the air cylinder. To conserve the compressed air injected into the housing, it is only released to the nest inlets when the air cylinder is activated to lower the cold plate. The control system for this function is shown in FIG. 7.

Dry compressed air at preferably 85–90 psi is provided to the two compressed air inlets 702. One inlet directs air routed from the TCB to the nest air cylinder fitting supplying compressed air that moves the cold plate to the down position. The other inlet feeds air through the control system to the nest inlet nozzles. The air provided to the nest is also called purge air due to its function of purging humid air from within the Lexan (TM) housing. From this second inlet location, purge air passes through a manual shutoff valve 704 used for system maintenance, air flow calibration or emergencies. The air is then regulated to 80 psi by pressure regulator 706, and then sent to the pneumatic control valve 708. The normally closed pneumatic valve is opened by air pressure in air line 712. Airline 712 is connected to "T" fitting 714 which passes air from the TCB at inlet 702 through 714 to the air cylinder port driving downward movement of the cold plate and related hardware. Pneumatic control valve 708 allows purge air to pass through the air flow meter 710 when air pressure is in line 712 and the air cylinder is actuated downward.

During calibration, this meter 710 is set to the flow rate needed to support nest condensation control. The meter also serves as a diagnostic tool to verify dry air flow. From the flow meter, the purge air is divided by a "T" fitting to support flow to both the front and rear inlet nozzles attached to the nest Lexan (TM) housing (not shown). Air flow control components are connected as necessary by flexible polymer tubing.

In a preferred embodiment, compressed air is provided to the enclosure only when the cold plate is in the down position. As described above, this is preferably achieved by a valve positioned so that when air is supplied to the cylinder to move it to the down position, air is also supplied to the purge lines, flooding the enclosure with dry compressed air. When the cylinder is not in the down position (i.e., when the chip is not in test and the cooling system is not engaged), air is cut off from the enclosure, conserving dry compressed air so it is only provided when needed or during test, as appropriate.

Figure 8:
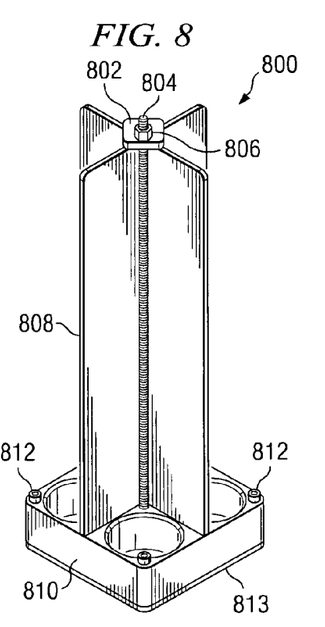
FIG. 8 shows a heat sink assembly for hose entry locations consistent with a preferred embodiment.

FIG. 8 shows an innovative heat sink and hose insulation retention device, implemented in preferred embodiments to prevent liquid condensation at the top of the TCB, where the coolant supply and return hoses enter and exit. In a preferred embodiment, all such hoses are located on a top corner of the TCB in close proximity such that the insulation of all four hoses touch one another. When coolant passes through the hoses at low temperature, the areas of intersection of insulation are depressed to below the dew point. Humidity in the test room ambient air causes liquid condensation to form at these low temperature locations on the insulation. This condensation tends to collect and pool, threatening electronics of the test equipment. To eliminate this condensation, a metal heat sink 800 as shown in FIG. 8, made preferably from aluminum (Al), is inserted between the hose insulation contact areas. Heat from the test room air is convected to the metal heat sink where it is conducted through the heat sink to the surface of the insulation. This raises the insulation surface temperature above the ambient dew point temperature. It thereby prevents condensation at those surfaces where the heat sink touches the insulation. In a preferred embodiment, heat sink/retention device 800 includes retainer 802 with threaded rod 804 and nut 806 for securing the device to the TCB. Flanges 808 separate hose surfaces and conduct heat from the ambient air to warm the hose insulation to above dew point. Plate cavity 810 is provided for insulated hoses to be inserted, retaining the insulation on the hoses by pressure between the hose itself and the cavity walls. The cavity plate is preferably made from a polymer. Socket head cap screws 812 are also depicted, which helps retain the device to the TCB.

Figure 9:
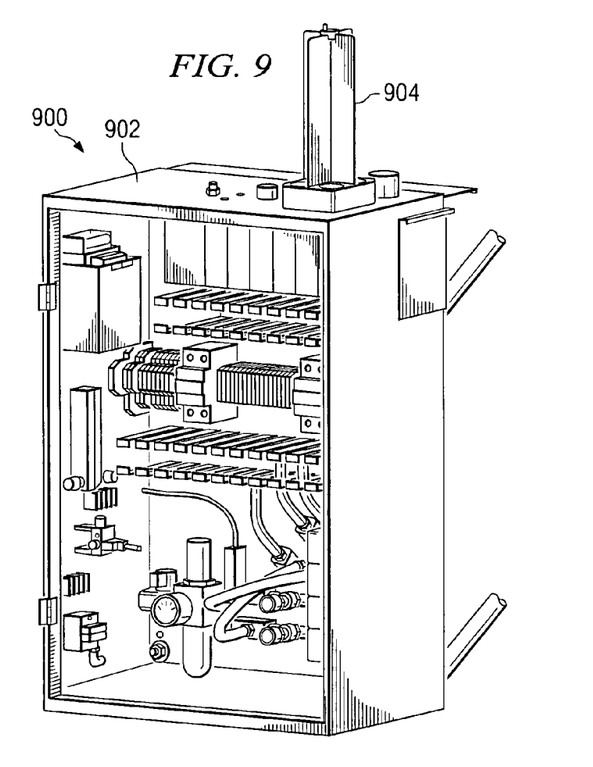
FIG. 9 shows a thermal control box with heat sink assembly consistent with a preferred embodiment.

FIG. 9 shows the heat sink 904 in its preferred operating position atop TCB 900. Heat sink 904 attaches to a wall 902 of TCB 904, preferably the top surface.

In addition, the coolant hose insulation preferably extends only to the top of the mounting plate 813. The hose preferably mates with a polymer barbed fitting at this point. The mounting plate 813 ensures that insulation mates with the TCB to prevent humid air from gaining access to the low temperature hose or fitting, causing condensation. For serviceability, it is preferable to provide a mechanism to facilitate removal of the insulation and hoses from the TCB. To retain the hose insulation, a polymer cavity plate contains properly sized orifices that establish a tight boundary with the hose insulation. The mounting plate is retained to the top of the TCB using the same nut that secures the barbed hose fittings to the TCB. Retention of the hose insulation against the mounting plate coupled with the close fitting orifices in the cavity plate provide the needed condensation control while simultaneously enabling disassembly for service.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for testing integrated circuits, comprising:
   a card for receiving an integrated circuit;
   an enclosure for limiting air movement near the integrated circuit, the enclosure substantially enclosing the integrated circuit and a cold plate, wherein the cold plate is supplied with chilled fluid through chilled fluid lines, the chilled fluid lines enter the enclosure at openings, and wherein the openings are concentrically aligned with the fluid lines and insulation on the fluid lines when the cold plate is pressed against a surface of the integrated circuit for testing, and wherein the cold plate includes at least one heater embedded within the cold plate that responds to a feedback loop that detects a temperature of the integrated circuit at various locations by use of an on chip temperature sensor embedded in the integrated circuit in order to provide automatic fine temperature control of the integrated circuit; and
   wherein a dry gas is injected into the enclosure.

2. The system of claim 1, wherein the dry gas is injected into the enclosure by nozzles positioned so as to establish a rotational gas flow pattern within the enclosure.

3. The system of claim 1, wherein the dry gas is injected into the enclosure at a rate sufficient to maintain the relative humidity within the enclosure at levels preventing condensation on metal surfaces.

4. The system of claim 1, wherein the card for receiving the integrated circuit includes at least one heater connected to deliver heat to a backside of the card, wherein the backside of the card is outside the enclosure.

5. The system of claim 1, further comprising a control box having hoses which pass through the control box, at least some of the hoses carrying chilled fluid; and
   wherein a dry gas is injected into the control box.

6. The system of claim 1, wherein the temperature of the integrated circuit is determined by an output of the on chip temperature sensor, and wherein the at least one heater embedded within the cold plate responds to the feedback ioop based on the output of the on chip temperature sensor.

7. A method for testing integrated circuits, comprising the steps of:
   receiving an integrated circuit into a card;
   supplying a cold plate with a chilled fluid through chilled fluid lines, the chilled fluid lines enter an enclosure at openings;
   pressing the cold plate against a surface of the integrated circuit, wherein the openings are concentrically aligned with the fluid lines and insulation on the fluid lines when the cold plate is pressed against the integrated circuit for testing, and wherein the cold plate includes at least one heater embedded within the cold plate that responds to a feedback loop that detects a temperature of the integrated circuit at various locations by use of an on chip temperature sensor embedded in the integrated circuit in order to provide automatic fine temperature control of the integrated circuit;
   enclosing at least the cold plate and the integrated circuit within the enclosure; and
   supplying the enclosure with a dry gas.

8. 21. The method of claim 7, wherein the dry gas is injected into the enclosure by nozzles positioned so as to establish a rotational gas flow pattern within the enclosure.

9. The method of claim 7, wherein the dry gas is injected into the enclosure at a rate sufficient to maintain the relative humidity within the enclosure at levels preventing condensation on metal surfaces.

10. The method of claim 7, wherein the integrated circuit is positioned in a card, and wherein the card includes at least one heater connected to deliver heat to a backside of the card, wherein the backside of the card is outside the enclosure.

11. The method of claim 7, wherein a control box is injected with a dry gas, the control box having hoses which pass through carrying chilled fluid.

12. The method of claim 7, wherein the temperature of the integrated circuit is determined by an output of the on chip temperature sensor, and wherein the at least one heater embedded within the cold plate responds to the feedback loop based on the output of the on chip temperature sensor.

* * * * *